US012206184B2

(12) United States Patent
Choi et al.

(10) Patent No.: US 12,206,184 B2
(45) Date of Patent: Jan. 21, 2025

(54) ANTENNA PACKAGE AND IMAGE DISPLAY DEVICE INCLUDING THE SAME

(71) Applicants: DONGWOO FINE-CHEM CO., LTD., Jeollabuk-do (KR); POSTECH RESEARCH AND BUSINESS DEVELOPMENT FOUNDATION, Gyeongsangbuk-do (KR)

(72) Inventors: Byung Jin Choi, Incheon (KR); Na Yeon Kim, Seoul (KR); Young Ju Kim, Gyeonggi-do (KR); Won Bin Hong, Seoul (KR)

(73) Assignees: DONGWOO FINE-CHEM CO., LTD., Jeollabuk-do (KR); POSTECH RESEARCH AND BUSINESS DEVELOPMENT FOUNDATION, Gyeongsangbuk-do (KR)

( * ) Notice: Subject to any disclaimer, the term of this patent is extended or adjusted under 35 U.S.C. 154(b) by 139 days.

(21) Appl. No.: 17/977,205

(22) Filed: Oct. 31, 2022

(65) Prior Publication Data

US 2023/0052259 A1 Feb. 16, 2023

Related U.S. Application Data

(63) Continuation of application No. PCT/KR2021/005422, filed on Apr. 29, 2021.

(30) Foreign Application Priority Data

Apr. 29, 2020 (KR) .................. 10-2020-0052083

(51) Int. Cl.
*H01Q 5/35* (2015.01)
*H01Q 1/24* (2006.01)
*H01Q 9/04* (2006.01)

(52) U.S. Cl.
CPC .............. *H01Q 5/35* (2015.01); *H01Q 1/241* (2013.01); *H01Q 9/0407* (2013.01)

(58) Field of Classification Search
USPC ........................................................ 343/702
See application file for complete search history.

(56) References Cited

U.S. PATENT DOCUMENTS 6,937,193 B2* 8/2005 Hendler ................... H01Q 1/38
343/846
7,450,077 B2* 11/2008 Waterhouse ............. H01Q 9/28
343/718

(Continued)

FOREIGN PATENT DOCUMENTS

CN 110167261 A 8/2019
CN 215119242 U 12/2021

(Continued)

OTHER PUBLICATIONS

Notice of Allowance issued on Mar. 20, 2024 from Korean Patent Office in a counterpart Korean Patent Application No. 10-2020-0052083 (all the cited references are listed in this IDS.) (English translation is also submitted herewith.).

(Continued)

*Primary Examiner* — Hoang V Nguyen
*Assistant Examiner* — Brandon Sean Woods
(74) *Attorney, Agent, or Firm* — The PL Law Group, PLLC

(57) ABSTRACT

An antenna package according to an embodiment includes an antenna unit including a radiator, a transmission line extending from the radiator and an antenna ground pad disposed around the transmission line, and a circuit board electrically connected to the antenna unit. The circuit board includes a core layer, a circuit wiring layer disposed on one surface of the core layer, the circuit wiring layer including a signal transmission wiring electrically connected to the (Continued)

transmission line of the antenna unit and a first ground pattern bonded to the antenna ground pad, and a ground layer disposed on an opposite surface facing the one surface of the core layer. The ground layer does not overlap a portion of the antenna ground pad except for a region bonded to the first ground pattern in a planar view.

17 Claims, 7 Drawing Sheets

(56) References Cited

U.S. PATENT DOCUMENTS

| | | |
|---|---|---|
| 2004/0125020 A1 | 7/2004 | Hendler et al. |
| 2007/0285324 A1 | 12/2007 | Waterhouse et al. |
| 2015/0207236 A1* | 7/2015 | Felic .................... H01Q 21/065 |
| | | 343/753 |
| 2019/0326682 A1 | 10/2019 | Qin |
| 2021/0274645 A1* | 9/2021 | Hong .................... H05K 1/0219 |

FOREIGN PATENT DOCUMENTS

| | | |
|---|---|---|
| KR | 10-2013-0063139 A | 6/2013 |
| KR | 10-2013-0095451 A | 8/2013 |
| KR | 10-1962821 B1 | 7/2019 |
| KR | 10-2020-0005010 A | 1/2020 |
| KR | 10-2020-0010906 A | 1/2020 |
| KR | 10-2020-0039321 A | 4/2020 |
| TW | 201328021 A | 7/2013 |

OTHER PUBLICATIONS

International Search Report for PCT/KR2021/005422 mailed on Aug. 10, 2021.

Office action issued on Nov. 10, 2024 from China Patent Office in a counterpart China Patent Application No. 202110450012.4 (English translation is also submitted herewith.).

* cited by examiner

ANTENNA PACKAGE AND IMAGE DISPLAY DEVICE INCLUDING THE SAME

CROSS-REFERENCE TO RELATED APPLICATION AND CLAIM OF PRIORITY

This present application is a continuation of application to International Application No. PCT/KR2021/005422 with an International Filing Date of Apr. 29, 2021, which claims the benefit of Korean Patent Applications No. 10-2020-0052083 filed on Apr. 29, 2020 at the Korean Intellectual Property Office, the disclosures of which are incorporated by reference herein in their entirety.

BACKGROUND

1. Field

The present invention relates to an antenna package and an image display device including the same. More particularly, the present invention relates to an antenna package including an antenna device and a circuit board and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

As mobile communication technologies have been rapidly developed, an antenna capable of operating a high frequency or ultra-high frequency communication is needed in the image display device.

However, as a driving frequency of the antenna increases, a signal loss may also increase. Further, as a length of a transmission path increases, a degree of the signal loss may further increase.

Further, when an intermediate circuit structure such as a flexible printed circuit board (FPCB) is used to electrically connect a driving integrated circuit chip and the antenna for an antenna feeding/driving control, additional signal loss and signal disturbance may occur.

For example, radiation and impedance properties through radiation electrodes and/or pads included in the antenna may be disturbed by wirings or electrode patterns included in the FPCB.

Thus, an antenna design to stably implement radiation in a desired high-frequency band while being free from an influence of the intermediate circuit structure is needed. For example, Korean Patent Application Publication No. 2013-0095451 discloses an antenna integrated with a display panel, but the efficient circuit connection is not provided.

SUMMARY

According to an aspect of the present invention, there is provided an antenna package having improved operational reliability and signaling efficiency.

According to an aspect of the present invention, there is provided an image display device including an antenna package with improved operational reliability and signaling efficiency.

(1) An antenna package, including: an antenna unit including a radiator, a transmission line extending from the radiator and an antenna ground pad disposed around the transmission line; and a circuit board electrically connected to the antenna unit, the circuit board including: a core layer; a circuit wiring layer disposed on one surface of the core layer, the circuit wiring layer including a signal transmission wiring electrically connected to the transmission line of the antenna unit and a first ground pattern bonded to the antenna ground pad; and a ground layer disposed on an opposite surface facing the one surface of the core layer, wherein the ground layer does not overlap a portion of the antenna ground pad except for a region bonded to the first ground pattern in a planar view.

(2) The antenna package according to the above (1), wherein the antenna ground pad includes a bonding region bonded to the first ground pattern and a non-bonding region that does not overlap the first ground pattern in the planar view.

(3) The antenna package according to the above (2), wherein the ground layer of the circuit board does not cover the non-bonding region of the antenna ground pad in the planar view.

(4) The antenna package according to the above (3), wherein the ground layer of the circuit board partially covers the bonding region of the antenna ground pad in the planar view.

(5) The antenna package according to the above (4), wherein an overlapping area of the ground layer and the antenna ground pad is 20% or less of an area of the bonding region.

(6) The antenna package according to the above (2), wherein the non-bonding region has a mesh-pattern structure, and the bonding region has a solid pattern structure.

(7) The antenna package according to the above (1), wherein the ground layer of the circuit board does not overlap the antenna ground pad in the planar view.

(8) The antenna package according to the above (1), wherein the antenna unit further includes a signal pad connected to an end portion of the transmission line and bonded to the signal transmission wiring of the circuit board.

(9) The antenna package according to the above (8), wherein the antenna ground pad includes a pair of antenna ground pads facing each other with the signal pad interposed therebetween.

(10) The antenna package according to the above (9), wherein the first ground pattern includes a pair of first ground patterns around the signal transmission line, and each of the pair of first ground patterns is aligned on each of the pair of antenna ground pads.

(11) The antenna package according to the above (8), wherein a length of the antenna ground pad is greater than a length of the signal pad and is smaller than a total length of the transmission line and the signal pad.

(12) The antenna package according to the above (1), wherein the circuit board further includes a first ground contact penetrating the core layer and electrically connecting the first ground pattern and the ground layer with each other.

(13) The antenna package according to the above (1), further including an antenna driving integrated circuit (IC) chip electrically connected to an end portion of the circuit board.

(14) The antenna package according to the above (13), wherein the ground layer of the circuit board does not overlap the antenna driving IC chip in the planar view.

(15) The antenna package according to the above (13), wherein the antenna unit includes a plurality of antenna units, the signal transmission wiring included in the circuit wiring layer of the circuit board includes a plurality of signal transmission wirings connected to the transmission line of each of the plurality of antenna units, and end portions of the plurality of signal transmission wirings are electrically connected to the antenna driving IC chip.

(16) The antenna package according to the above (15), wherein the circuit wiring layer further includes a second ground pattern disposed around the end portions of the plurality of signal transmission wirings to be electrically separated therefrom.

(17) The antenna package according to the above (16), wherein the circuit board further includes a second ground contact penetrating the core layer and electrically connecting the ground layer and the second ground pattern with each other.

(18) An image display device including the antenna package according to embodiments as described above.

In an antenna package in which a circuit board including a signal transmission wiring and a ground layer are combined according to embodiments of the present invention, the signal transmission wiring may be connected to a signal pad of an antenna unit, and the ground layer may be disposed so as not to overlap a non-bonding region of an antenna ground pad of the antenna unit in a vertical direction.

Accordingly, radiation disturbance due to an interaction between the antenna ground pad and the ground layer may be suppressed. Further, an efficiency of a horizontal radiation through the antenna ground pad may be increased.

In some embodiments, the ground layer may be substantially removed in a chip mounting region connected to an antenna driving integrated circuit (IC) chip. Accordingly, efficiency of signal transmission and feeding between the antenna driving IC chip and the signal transmission wiring may be enhanced.

DETAILED DESCRIPTION OF THE EMBODIMENTS

According to exemplary embodiments of the present invention, there is provided an antenna package in which an antenna unit, and a circuit board that may include a signal transmission wiring and a ground layer are combined. Further, an image display device including the antenna package is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", etc., used in this application are not intended to designate an absolute position, but to relatively distinguish different elements and positions.

The terms "one surface" and "opposite surface" used in the present application may refer to two different surfaces, e.g., two surfaces facing each other, and may be used to distinguish an upper surface and a lower surface.

Figure 1:
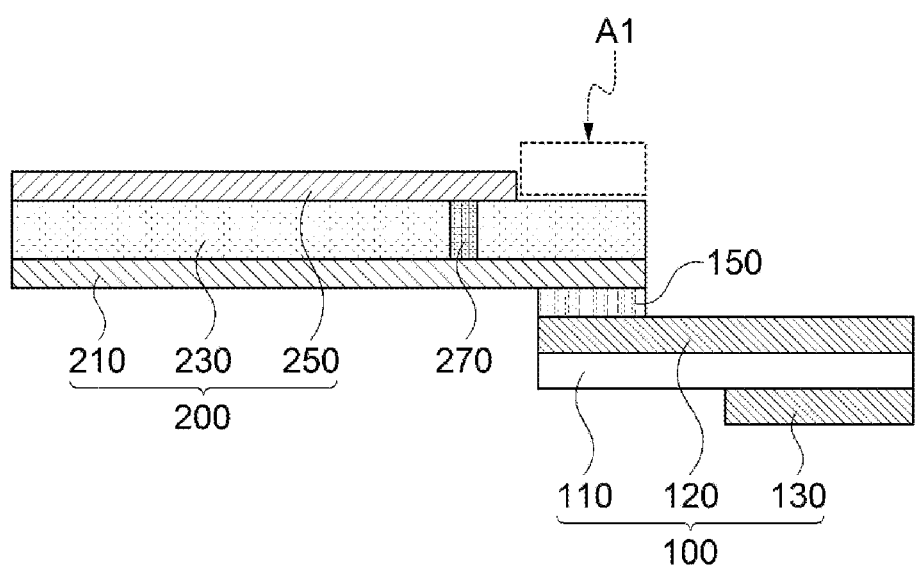
FIGS. 1 and 2 are a schematic cross-sectional view and a schematic top planar view, respectively, illustrating an antenna package in accordance with exemplary embodiments.
Figure 2:
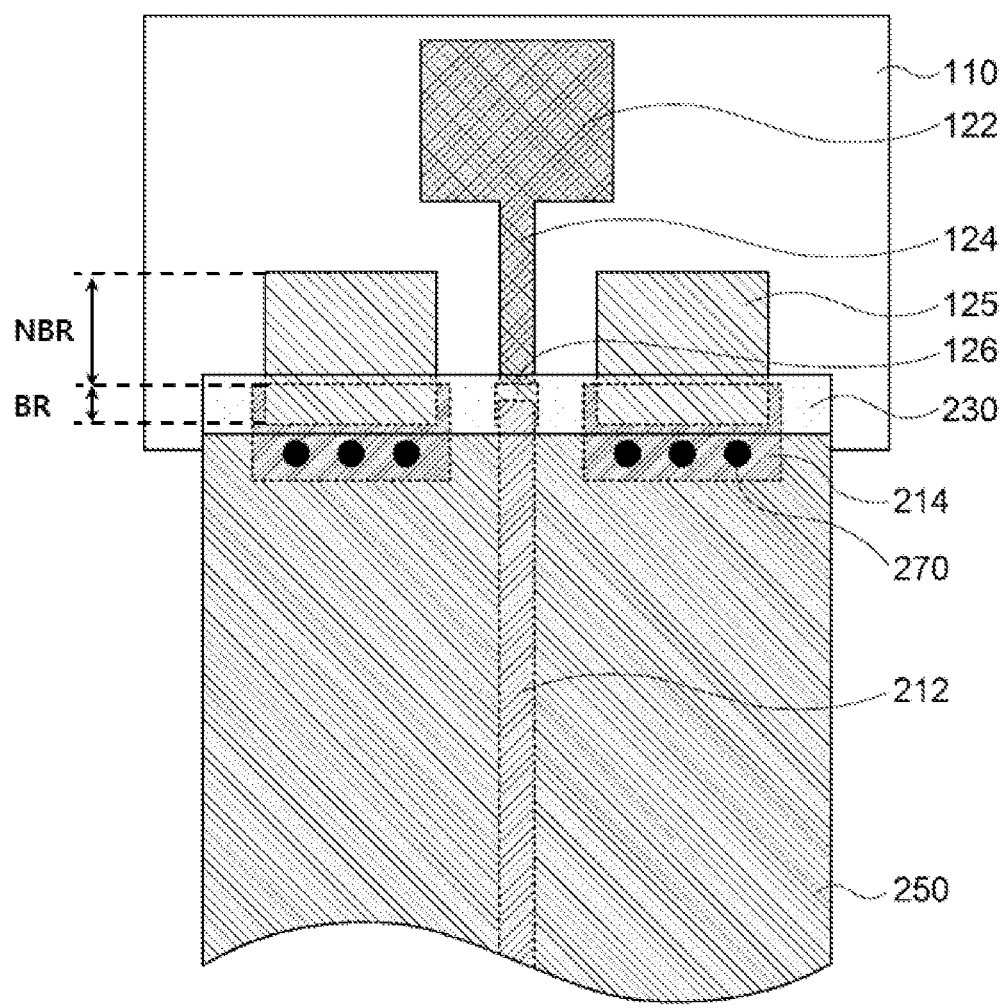

FIGS. 1 and 2 are a schematic cross-sectional view and a schematic top planar view, respectively, illustrating an antenna package in accordance with exemplary embodiments.

Referring to FIGS. 1 and 2, the antenna package may include an antenna device 100 and a circuit board 200. The circuit board 200 may include a core layer 230, a circuit wiring layer 210 and a ground layer 250, and the circuit wiring layer 210 and an antenna unit included in the antenna device 100 may be electrically connected to each other.

The antenna device 100 may include an antenna dielectric layer 110 and an antenna electrode layer 120 disposed on the antenna dielectric layer 110.

The antenna dielectric layer 110 may include, e.g., a transparent resin film such as a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more thereof.

The antenna dielectric layer 110 may include an adhesive material such as an optically clear adhesive (OCA), an optically clear resin (OCR), or the like. In some embodiments, the antenna dielectric layer 110 may include an inorganic insulating material such as glass, silicon oxide, silicon nitride, silicon oxynitride, etc.

In some embodiments, a dielectric constant of the antenna dielectric layer 110 may be adjusted in a range from about 1.5 to about 12. When the dielectric constant exceeds about 12, a driving frequency may be excessively decreased, so that driving in a desired high frequency or ultrahigh frequency band may not be implemented.

The antenna electrode layer 120 may be formed on an upper surface of the antenna dielectric layer 110. As illustrated in FIG. 2, the antenna electrode layer 120 may include an antenna unit including a radiator 122.

In exemplary embodiments, the antenna unit may include an antenna pattern or a radiator capable of radiating at a high or ultra-high frequency band of 3G, 4G, 5G or more.

The antenna unit may further include a transmission line 124, a signal pad 126, and an antenna ground pad 125. The radiator 122 may have, e.g., a polygonal plate shape, and the transmission line 124 may extend from one side of the radiator 122 to be electrically connected to the signal pad 126. The transmission line 124 may be formed as a single member substantially integral with the radiator 122.

The signal pad 126 may be connected to an end portion of the transmission line 124. The signal pad 126 may be provided as a member substantially integral with the transmission line 124, and the end portion of the transmission line 124 may serve as the signal pad 126.

In exemplary embodiments, a pair of the antenna ground pads 125 may face each other with the transmission line 124 or the signal pad 126 interposed therebetween. The antenna ground pad 125 may be electrically and physically separated from the transmission line 124 and the signal pad 126.

The antenna ground pad 125 may have a length and an area greater than those of the signal pad 126. In an embodiment, the antenna ground pad 125 may have a length smaller than a total length of the signal pad 126 and the transmission line 124.

In exemplary embodiments, a vertical radiation (e.g., a radiation in a thickness direction of the antenna device 100) may be substantially implemented through the radiator 122. Additionally, the antenna ground pads 125 may face each other and may be adjacent to the radiator 122, so that a horizontal radiation may be implemented by the antenna ground pad 125.

Accordingly, the vertical radiation may be substantially implemented in an area where the radiator 122 is disposed, and the horizontal radiation may be substantially implemented in an area where the antenna ground pads 125 are disposed.

The antenna unit may include silver (Ag), gold (Au), copper (Cu), aluminum (Al), platinum (Pt), palladium (Pd), chromium (Cr), titanium (Ti), Tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna unit may include a transparent conductive oxide such indium tin oxide (ITO), indium zinc oxide (IZO), zinc oxide (ZnOx), indium zinc tin oxide (IZTO), etc.

In some embodiments, the antenna unit may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

In some embodiments, the radiator 122 and the transmission line 124 may include a mesh-pattern structure to improve transmittance. In this case, a dummy mesh pattern (not illustrated) may be formed around the radiator 122 and the transmission line 124.

The signal pad 126 and the antenna ground pad 125 may be solid patterns formed of the above-described metal or alloy in consideration of reduction of a feeding resistance, improvement of noise absorption efficiency, horizontal radiation properties, etc.

In some embodiments, at least a portion of the antenna ground pad 125 may have a solid pattern structure. In an embodiment, a portion of the antenna ground pad 125 adjacent to the radiator (e.g., a non-bonding region NBR) may have a mesh-pattern structure, and a remaining portion of the antenna ground pad 125 (e.g., a bonding region BR) may have the solid pattern structure. For example, the non-bonding region NBR adjacent to the radiator 122 from the antenna ground pad 125 may be disposed in a display area of an image display device together with the radiator 122.

In some embodiments, an antenna ground layer 130 may be disposed on a lower surface of the antenna dielectric layer 110. The antenna ground layer 130 may be disposed to face the radiator 122 with the antenna dielectric layer 110 interposed therebetween. Accordingly, a vertical radiation through the radiator 122 may be promoted.

As illustrated in FIG. 1, the antenna ground layer 130 may overlap a portion of the antenna electrode layer 120 in a thickness direction. For example, the antenna ground layer 130 may not overlap the antenna ground pad 125 in a planar view. Accordingly, efficiency or concentration of the horizontal radiation by the antenna ground pad 125 may be improved.

In an embodiment, a conductive member of a display device to which the antenna package is applied may serve as the antenna ground layer 130.

The conductive member may include, e.g., a gate electrode of a thin film transistor (TFT) included in a display panel, various wirings such as scan lines or data lines or various electrodes such as pixel electrodes or common electrodes.

In an embodiment, a metallic member such as a SUS plate, a sensor member such as a digitizer, a heat dissipation sheet, etc., disposed at a rear portion of the display device may serve as the antenna ground layer 130.

The circuit board 200 may be electrically connected to the antenna device 100 via the signal pad 126 of the antenna unit. In exemplary embodiments, the circuit board 200 may be a flexible printed circuit board (FPCB).

The circuit board 200 may include the core layer 230, the circuit wiring layer 210 and the ground layer 250.

The core layer 230 may include, e.g., a flexible resin such as polyimide resin, Modified Polyimide (MPI), epoxy resin, polyester, cycloolefin polymer (COP), liquid crystal polymer (LCP), or the like.

The circuit wiring layer 210 may be formed on one surface of the core layer 230 (a bottom surface of the core layer 230 illustrated in FIG. 1), and may include a signal transmission wiring 212 and a first ground pattern 214.

The signal transmission wiring 212 may be electrically connected to the signal pad 126 of the antenna unit. The first ground pattern 214 may be electrically connected to the antenna ground pad 125 of the antenna unit.

A pair of the first ground patterns 214 may face each other with the signal transmission wiring 212 interposed therebetween, and may be electrically connected to each antenna ground pad 125.

As illustrated in FIG. 1, the circuit wiring layer 210 and the antenna electrode layer 120 may be bonded to each other through a conductive intermediate structure 150. For example, the conductive intermediate structure 150 may include an anisotropic conductive film (ACF).

In this case, the conductive intermediate structure 150 may be inserted into a region where the circuit board 200 and the antenna device 100 overlap each other, and the circuit board 200 and the antenna element 100 may be heat-pressed to each other.

Accordingly, the signal transmission wiring 212 and the signal pad 126 may be electrically connected to each other through the conductive intermediate structure 150. The first ground pattern 214 and the antenna ground pad 125 may also be electrically connected to each other through the conductive intermediate structure 150.

The first ground pattern 214 may be bonded to the antenna ground pad 125, so that a bonding stability between the circuit board 200 and the antenna device 100 may be improved. The first ground pattern 214 may serve as a bonding pattern for the above-described bonding process with the antenna device 100.

As illustrated in FIG. 2, the antenna ground pad 125 and the first ground pattern 214 may partially overlaying each other in a planar view. In exemplary embodiments, the antenna ground pad 125 may be divided into the non-bonding region NBR and the bonding region BR. The bonding region BR may be a portion of the antenna ground pad 125 that is bonded to the first ground pattern 214 of the circuit board 200 (a region overlapping the first ground pattern 214 in the planar view).

The non-bonding region NBR may be a remaining portion of the antenna ground pad 125 excluding the bonding region BR. For example, the non-bonding region NBR may be a portion that may not overlap the first ground pattern 214 of the circuit board 200 in the planar view.

In some embodiments, the non-bonding region NBR of the antenna ground pad 125 may function as an auxiliary radiator. For example, as described above, the non-bonding region NBR of the antenna ground pad 125 may be adjacent to the radiator 122 to implement the horizontal radiation.

The ground layer 250 may be formed on an opposite surface of the core layer 230 (e.g., a top surface of the core layer 230 in FIG. 1). The opposite surface may refer to a surface facing the one surface on which the circuit wiring layer 210 is formed.

The core layer 230 may overlap the antenna ground pad 125 in the planar view. In exemplary embodiments, an overlapping area of the ground layer 250 and the antenna ground pad 125 may be smaller than an overlapping area of the core layer 230 and the antenna ground pad 125.

In some embodiments, the overlapping area of the ground layer 250 and the antenna ground pad 125 in the planar view may be 10% or less of an area of the antenna ground pad 125.

In an embodiment, the ground layer 250 may be disposed so as not to substantially overlap the non-bonding region NBR of the antenna ground pad 125 included in the antenna device 100 in the planar view. For example, the ground layer 250 of the circuit board 200 may be substantially excluded over the non-bonding region NBR of the antenna ground pad 125.

In a preferable embodiment, as illustrated in FIG. 2, the ground layer 250 may not overlap the antenna ground pad 125 included in the antenna device 100 in the planar view.

In an embodiment, the ground layer 250 may not cover the non-bonding region NBR of the antenna ground pad 125 in the planar view, and may partially cover the bonding region BR. In this case, the ground layer 250 may overlap or cover about 20% or less of an area of the bonding region BR.

Accordingly, as illustrated in FIG. 1, a first open region A1 may be formed on the opposite surface of the core layer 230 by a space from which a conductive layer such as the ground layer 250 or a conductive pattern is substantially removed at a portion overlapping the antenna ground pad 125 in the thickness direction.

In some embodiments, the ground layer 250 and the first ground pattern 214 included in the circuit wiring layer 210 may be electrically connected to each other via a first ground contact 270. For example, the ground layer 250 may not overlap the antenna ground pad 125 in the planar view as described above, and may partially overlap the first ground pattern 214. The first ground contact 270 may be formed through the core layer 230 and may electrically connect the ground layer 250 and the first ground pattern 214 to each other.

The ground layer 250 and the first ground pattern 214 may be connected to each other through the first ground contact 270, so that the noise absorption/blocking efficiency may be enhanced, and reliability of feeding/signal transmission to the antenna device 100 may be improved.

According to the above-described exemplary embodiments, antenna driving reliability may be improved using the noise absorption by the ground layer 250 on the opposite surface of the circuit board 200. Further, an area occupied by the ground layer 250 may be reduced or substantially removed on a functional area of the antenna ground pad 125 of the antenna unit, so that radiation disturbance in the antenna ground pad 125 caused by the ground layer 250 may be avoided.

For example, as described above, the ground layer 250 may be substantially removed from the first open region A1, so that a region of the antenna device 100 in which the antenna ground pad 125 is disposed may be substantially converted into a horizontal radiation region. For example, the non-bonding region NBR of the antenna ground pad 125 may serve as a substantially horizontal radiator.

Accordingly, a region in which the radiator 122 is disposed serve as a vertical radiation region, and may be separated from the horizontal radiation region without interference, thereby improving radiation and signal reliability, and suppressing signal loss.

Figure 3:
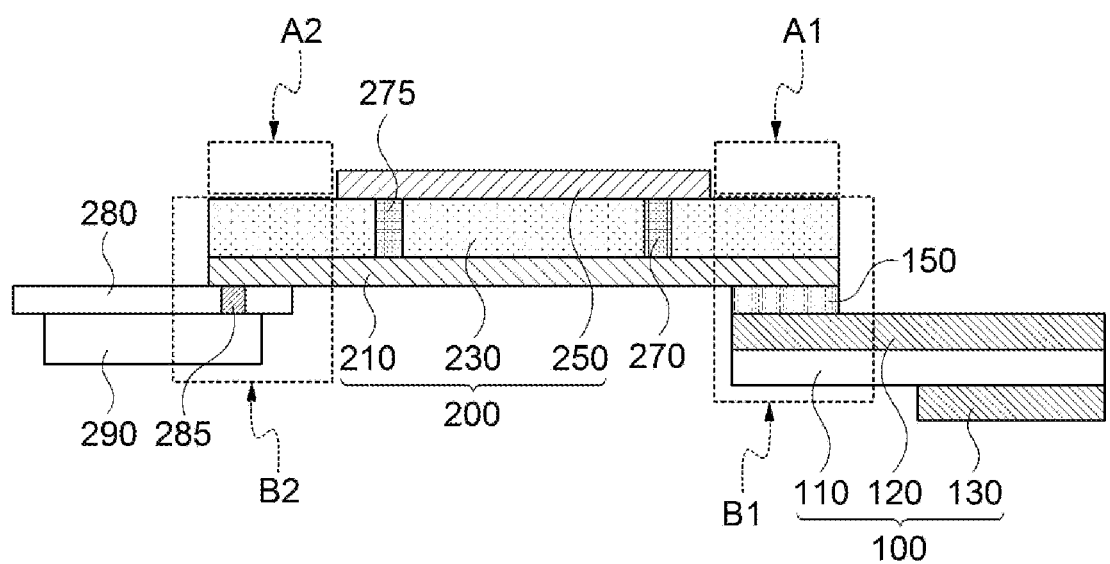
FIGS. 3 and 4 are a schematic cross-sectional view and a schematic top planar view, respectively, illustrating an antenna package in accordance with exemplary embodiments.
Figure 4:
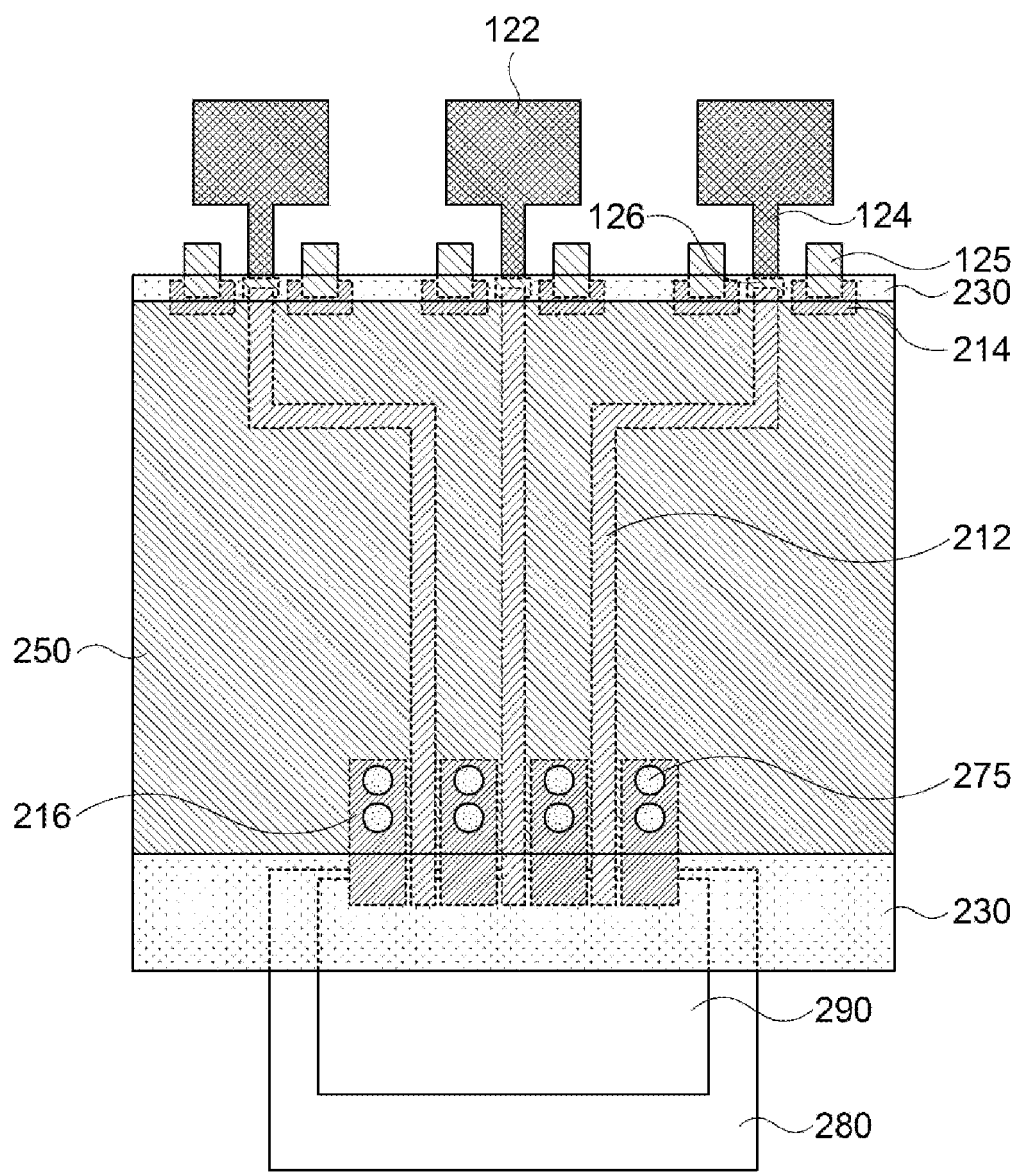

FIGS. 3 and 4 are a schematic cross-sectional view and a schematic top planar view, respectively, illustrating an antenna package in accordance with exemplary embodiments. Detailed descriptions of elements and/or structures substantially the same as or similar to those described with reference to FIGS. 1 and 2 are omitted. For convenience of descriptions, illustration of the antenna dielectric layer 110, the first ground contact 270, etc. is omitted in FIG. 4.

Referring to FIGS. 3 and 4, the antenna package may include an antenna driving integrated circuit (IC) chip 290.

In exemplary embodiments, one end portion of the circuit board 200 may be electrically connected to the antenna device 100 in a bonding region B1, and the other end portion of the circuit board 200 may be electrically connected to the antenna driving IC chip 290 in a chip mounting region B2.

For example, an intermediate circuit board 280 may be disposed between the other end of the circuit board 200 and the antenna driving IC chip 290 to electrically connect the circuit board 200 and the antenna driving IC chip 290 with each other. The intermediate circuit board 280 may be, e.g., a rigid printed circuit board. For example, the intermediate circuit board 280 may include an intermediate circuit pattern 285 formed in a prepreg substrate.

As illustrated in FIG. 4, the antenna device 100 may include a plurality of the antenna units arranged in an array form on the antenna dielectric layer 110. The circuit wiring layer 210 of the circuit board 200 may include a plurality of the signal transmission wirings 212 connected to each of the signal pads 126 of the antenna units.

The signal transmission wirings 212 may extend toward the chip mounting region B2 on the core layer 230. The terminal end portions of the signal transmission wirings 212 may be electrically connected to the antenna driving IC chip 290 through the intermediate circuit pattern 285 included in the intermediate circuit board 280. Accordingly, feeding and driving control signals from the antenna driving IC chip 290 may be transmitted to each antenna unit.

The antenna driving IC chip 290 may be directly mounted on the intermediate circuit board 280 by a surface mounting technology, or may be mounted using a conductive ball, solder, resist, or the like.

In some embodiments, the circuit wiring layer 210 of the circuit board 200 may further include a second ground pattern 216 disposed around the end portions of the signal transmission wirings 212. The second ground pattern 216 may be also disposed between signal transmission wirings 212 neighboring each other to absorb or shield a signal noise around the signal transmission wirings 212.

The second ground pattern 216 and the ground layer 250 of the circuit board 200 may be electrically connected to each other via a second ground contact 275 penetrating the core layer 230, so that noise absorption efficiency may be improved.

In exemplary embodiments, the ground layer 250 of the circuit board 200 may not extend over the chip mounting region B2 in a planar view. Accordingly, the ground layer 250 may not overlap the antenna driving IC chip 290 in a thickness direction as illustrated in FIG. 4. In an embodiment, the ground layer 250 may not overlap the intermediate circuit board 280 in the thickness direction.

Accordingly, as illustrated in FIG. 3, a conductive layer or a conductive pattern overlapping the antenna driving IC chip 290 and/or the intermediate circuit board 280 in the thickness direction may be substantially removed on the opposite surface of the core layer 230 such that a second open region A2 may be defined.

As described above, the ground layer 250 may be removed from the chip mounting region B2 overlapping the antenna driving IC chip 290, so that disturbance of feeding/radiation signals of corresponding frequency bands through the signal transmission wirings 212 may be prevented and signaling reliability may be improved.

In some embodiments, the antenna driving IC chip 290 may be directly mounted on the surface of the circuit board 200. In this case, the intermediate circuit board 280 may be omitted, and the antenna driving IC chip 290 may be directly connected to end portions of the signal transmission wirings 212.

Figure 5:
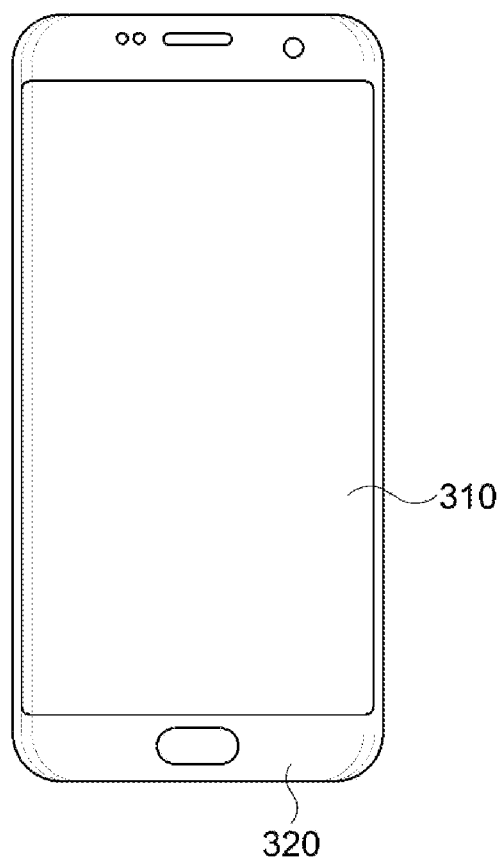
FIG. 5 is a schematic top planar view illustrating an image display device in accordance with exemplary embodiments.

FIG. 5 is a schematic top planar view illustrating an image display device in accordance with exemplary embodiments.

Referring to FIG. 5, the image display device 300 may be fabricated in the form of, e.g., a smart phone, and FIG. 5 shows a front face portion or a window surface of the image display device 300. The front face portion of the image display device 300 may include a display area 310 and a peripheral area 320. The peripheral area 320 may correspond to, e.g., a light-shielding portion or a bezel portion of an image display device.

The antenna device 100 included in the above-described antenna package may be disposed toward the front face portion of the image display device 300, and may be disposed on, e.g., a display panel. In an embodiment, the radiator 122 may be at least partially superimposed over the display area 310 in a planar view.

In this case, the radiator 122 may have a mesh-pattern structure, and a decrease in transmittance due to the radiator 122 may be prevented.

In some embodiments, the non-bonding region NBR of the antenna ground pad 125 may also be disposed in the display area 310 together with the radiator 122. In this case, the non-bonding region NBR of the antenna ground pad 125 may include a mesh-pattern structure.

The antenna driving IC chip 280 included in the antenna package may be disposed in the peripheral area 320 to prevent an image quality from being degraded in the display area 310.

In some embodiments, the antenna package may be bent by the circuit board 200 so that, e.g., the intermediate circuit board 280 and the antenna driving IC chip 280 may be disposed on a rear portion of the image display device 300.

As described above, vertical and horizontal radiations from the antenna unit may be independently implemented without a mutual interference while improving signaling reliability from the antenna driving IC chip 290 by the construction of the ground layer 250 of the circuit board 200.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

Experimental Example

Figure 6:
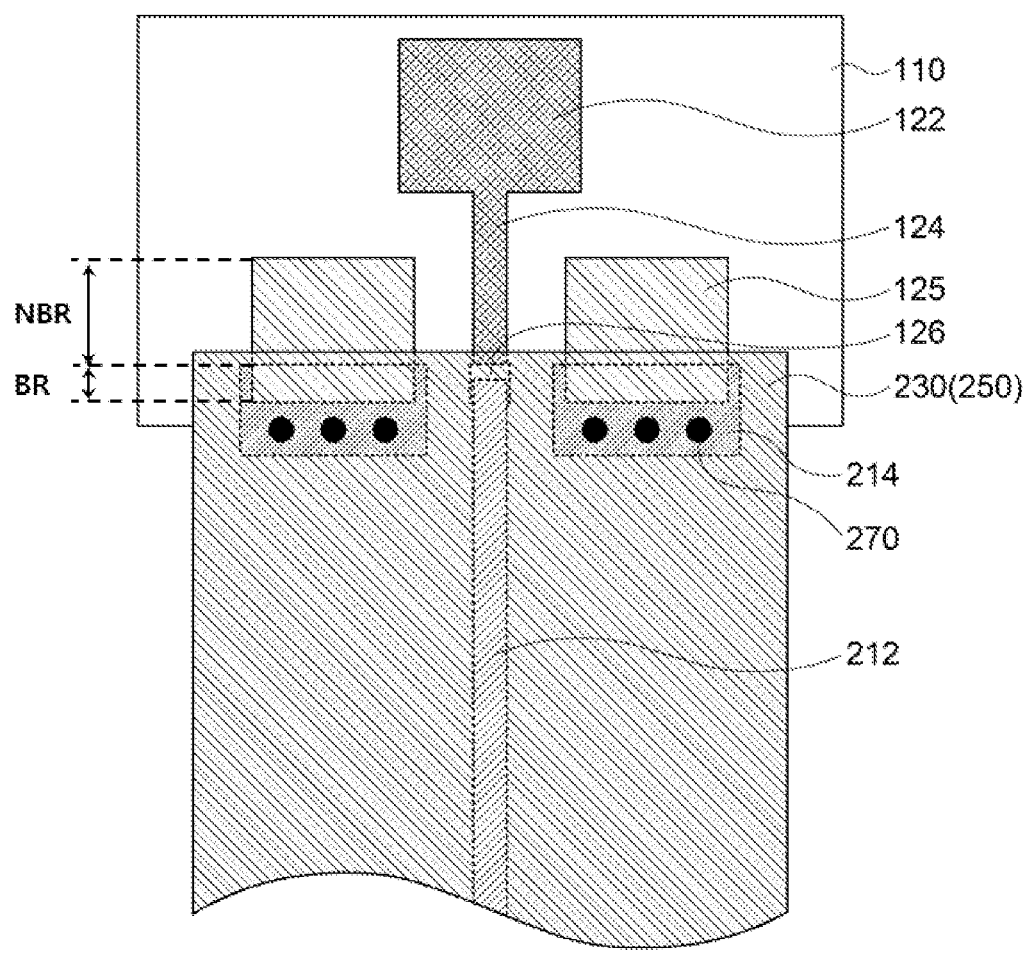
FIG. 6 is a schematic top planar view illustrating an antenna package in accordance with Comparative Example.

The antenna properties of antenna packages of Embodiments manufactured according to the structures illustrated in FIGS. 1 and 2, and an antenna package manufactured according to Comparative Example shown in FIG. 6 were evaluated.

Specifically, referring to FIG. 6, the antenna package of Comparative Example was manufacture to have a structure and a size the same as those of the antenna packages of Examples except that the ground layer 250 included in the circuit board completely covered the bonding region BR of the antenna ground pad 125 and also partially covered the non-bonding region NBR of the antenna ground pad 125 in a planar view.

In Examples and Comparative Examples, the radiator 122 and the transmission line 124 were formed to include a mesh pattern having a line width of 3 μm using a silver-palladium-copper (APC) alloy, and the antenna ground pad 125 and the signal pads 126 were each formed of a silver-palladium-copper (APC) alloy solid pattern structure.

A size of the radiator 122 was 2.4 mm×2.7 mm, and a size of the ground pad 125 was 2.765 mm×0.7 mm.

The circuit wiring layer 210 and the ground layer 250 included in the circuit board 200 were each formed as a copper layer, and an LCP was used as the core layer 230.

Specifically, in Example 1, the ground layer 250 was formed to cover an area of 20% of the bonding region BR of the antenna ground pad 125 bonded to the first ground pattern 214

In Example 2, as illustrated in FIG. 2, the ground layer 250 was entirely removed over the antenna ground pad 125.

While supplying a power to the circuit boards of the antenna packages of Examples and Comparative Examples, a loss level (S11) through the radiator was simulated by extracting S-parameters (S11) according to frequencies using a network analyzer.

Figure 7:
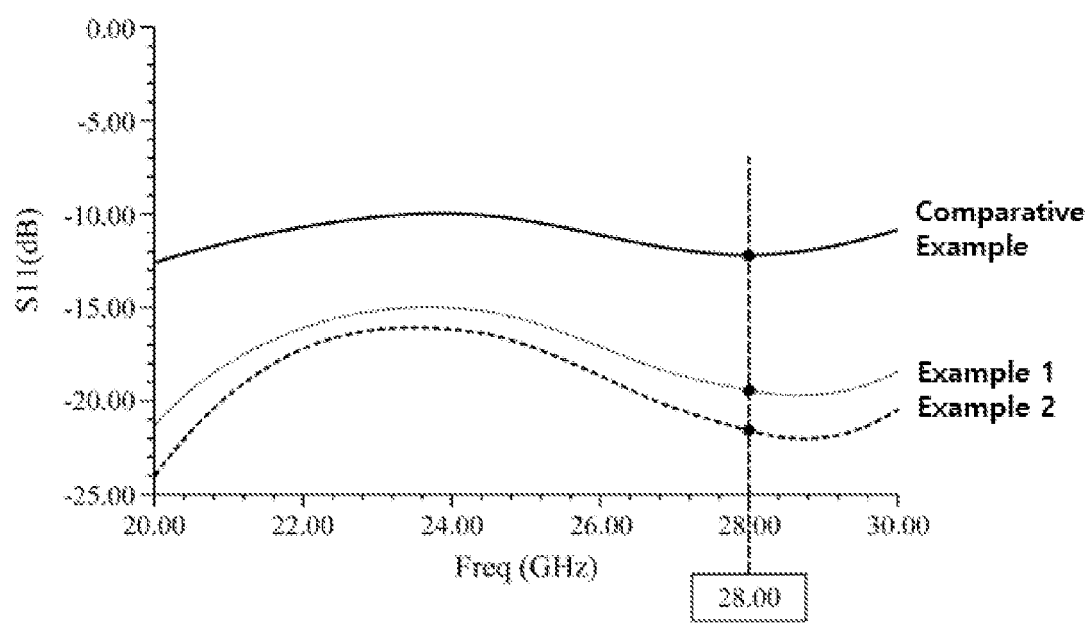
FIG. 7 is a graph showing radiation properties of antenna packages of Examples and Comparative Example.

FIG. 7 is a graph showing radiation properties of antenna packages of Example and Comparative Example.

Referring to FIG. 7, the antenna packages of Examples in which the ground layer 250 did not overlap the non-bonding region NBR of the antenna ground pad 125 provided remarkably reduced signal loss by, e.g., a conversion to a horizontal radiation in the bonding region B1.

What is claimed is:

1. An antenna package, comprising:
   an antenna unit comprising a radiator, a transmission line extending from the radiator and an antenna ground pad disposed around the transmission line; and
   a circuit board electrically connected to the antenna unit, the circuit board comprising:
      a core layer;
      a circuit wiring layer disposed on one surface of the core layer, the circuit wiring layer comprising a signal transmission wiring electrically connected to the transmission line of the antenna unit and a first ground pattern bonded to the antenna ground pad; and
      a ground layer disposed on an opposite surface facing the one surface of the core layer, wherein the ground layer does not overlap a portion of the antenna ground pad except for a region bonded to the first ground pattern in a planar view,
      wherein the antenna ground pad includes a bonding region bonded to the first ground pattern and a non-bonding region that does not overlap the first ground pattern in the planar view.

2. The antenna package according to claim 1, wherein the ground layer of the circuit board does not cover the non-bonding region of the antenna ground pad in the planar view.

3. The antenna package according to claim 2, wherein the ground layer of the circuit board partially covers the bonding region of the antenna ground pad in the planar view.

4. The antenna package according to claim 3, wherein an overlapping area of the ground layer and the antenna ground pad is 20% or less of an area of the bonding region.

5. The antenna package according to claim 1, wherein the non-bonding region has a mesh-pattern structure, and the bonding region has a solid pattern structure.

6. The antenna package according to claim 1, wherein the antenna unit further comprises a signal pad connected to an end portion of the transmission line and bonded to the signal transmission wiring of the circuit board.

7. The antenna package according to claim 6, wherein the antenna ground pad includes a pair of antenna ground pads facing each other with the signal pad interposed therebetween.

8. The antenna package according to claim 7, wherein the first ground pattern includes a pair of first ground patterns around the signal transmission line, and each of the pair of first ground patterns is aligned on each of the pair of antenna ground pads.

9. The antenna package according to claim 6, wherein a length of the antenna ground pad is greater than a length of the signal pad and is smaller than a total length of the transmission line and the signal pad.

10. The antenna package according to claim 1, wherein the circuit board further comprises a first ground contact penetrating the core layer and electrically connecting the first ground pattern and the ground layer with each other.

11. The antenna package according to claim 1, further comprising an antenna driving integrated circuit chip electrically connected to an end portion of the circuit board.

12. The antenna package according to claim 11, wherein the ground layer of the circuit board does not overlap the antenna driving integrated circuit chip in the planar view.

13. The antenna package according to claim 11, wherein the antenna unit includes a plurality of antenna units,
   the signal transmission wiring included in the circuit wiring layer of the circuit board includes a plurality of signal transmission wirings connected to the transmission line of each of the plurality of antenna units, and
   end portions of the plurality of signal transmission wirings are electrically connected to the antenna driving integrated circuit chip.

14. The antenna package according to claim 13, wherein the circuit wiring layer further comprises a second ground pattern disposed around the end portions of the plurality of signal transmission wirings to be electrically separated therefrom.

15. The antenna package according to claim 14, wherein the circuit board further comprises a second ground contact penetrating the core layer and electrically connecting the ground layer and the second ground pattern with each other.

16. An image display device comprising the antenna package according to claim 1.

17. An antenna package, comprising:
   an antenna unit comprising a radiator, a transmission line extending from the radiator and an antenna ground pad disposed around the transmission line; and
   a circuit board electrically connected to the antenna unit, the circuit board comprising:
      a core layer;
      a circuit wiring layer disposed on one surface of the core layer, the circuit wiring layer comprising a signal transmission wiring electrically connected to the transmission line of the antenna unit and a first ground pattern bonded to the antenna ground pad; and
      a ground layer disposed on an opposite surface facing the one surface of the core layer, wherein the ground layer does not overlap a portion of the antenna ground pad except for a region bonded to the first ground pattern in a planar view,
      wherein the ground layer of the circuit board does not overlap the antenna ground pad in the planar view.

\* \* \* \* \*